United States Patent
Enomoto et al.

(10) Patent No.: US 7,743,731 B2
(45) Date of Patent: Jun. 29, 2010

(54) REDUCED CONTAMINANT GAS INJECTION SYSTEM AND METHOD OF USING

(75) Inventors: Takashi Enomoto, Salem, MA (US); Masaaki Hagihara, Peabody, MA (US); Akiteru Ko, Peabody, MA (US); Shinji Hamamoto, Salem, MA (US); Masafumi Urakawa, Salem, MA (US); Arthur H. Laflamme, Jr., Rowley, MA (US); Edward Heller, Bedford, MA (US)

(73) Assignee: Tokyo Electron Limited, Tokyo (JP)

( * ) Notice: Subject to any disclaimer, the term of this patent is extended or adjusted under 35 U.S.C. 154(b) by 105 days.

(21) Appl. No.: 11/392,949

(22) Filed: Mar. 30, 2006

(65) Prior Publication Data

US 2007/0235136 A1    Oct. 11, 2007

(51) Int. Cl.
| | |
|---|---|
| C23C 16/50 | (2006.01) |
| C23C 16/505 | (2006.01) |
| C23C 16/509 | (2006.01) |
| C23C 16/06 | (2006.01) |
| C23C 16/22 | (2006.01) |

(52) U.S. Cl. ............... 118/723 E; 156/345.33; 156/345.34; 156/345.43; 156/345.45

(58) Field of Classification Search ............. 118/723 E; 156/345.33, 345.34, 345.43, 345.45
See application file for complete search history.

(56) References Cited

U.S. PATENT DOCUMENTS

| 5,024,748 | A * | 6/1991 | Fujimura ............... 204/298.38 |
| 6,334,983 | B1 * | 1/2002 | Okayama et al. ......... 422/186.29 |
| 6,427,621 | B1 * | 8/2002 | Ikegawa et al. .......... 118/723 MW |
| 2005/0255257 | A1 | 11/2005 | Choi et al. |
| 2006/0060138 | A1 | 3/2006 | Keller et al. |
| 2006/0213439 | A1 * | 9/2006 | Ishizaka .................. 118/715 |

OTHER PUBLICATIONS

International Search Report issued in International Application No. PCT/US07/61041, dated Sep. 26, 2007.
International Preliminary Report on Patentability issued in Application No. PCT/US07/061041, mailed. Oct. 9, 2008.

* cited by examiner

*Primary Examiner*—Rudy Zervigon

(57) ABSTRACT

A gas injection system includes a diffuser to distribute a process gas in a processing chamber. The gas injection system may be utilized in a polysilicon etching system involving corrosive process gases.

16 Claims, 8 Drawing Sheets

REDUCED CONTAMINANT GAS INJECTION SYSTEM AND METHOD OF USING

BACKGROUND OF THE INVENTION

1. Field of Invention

The present invention relates to a gas distribution system for a vacuum processing system, and more particularly to a gas distribution system for introducing a process gas in a vacuum processing system.

2. Description of Related Art

During semiconductor processing, a (dry) plasma etch process can be utilized to remove or etch material along fine lines or within vias or contacts patterned on a silicon substrate. The plasma etch process generally involves positioning a semiconductor substrate with an overlying patterned, protective mask layer, for example a photoresist layer, in a processing chamber.

Once the substrate is positioned within the chamber, an ionizable, dissociative gas mixture is introduced within the chamber at a pre-specified flow rate, while a vacuum pump is throttled to achieve an ambient process pressure. Thereafter, a plasma is formed when a fraction of the gas species present are ionized by electrons heated via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry.

Once the plasma is formed, selected surfaces of the substrate are etched by the plasma. The process is adjusted to achieve appropriate conditions, including an appropriate concentration of desirable reactant and ion populations to etch various features (e.g., trenches, vias, contacts, etc.) in the selected regions of the substrate. Such substrate materials where etching is required include silicon dioxide ($SiO_2$), low dielectric constant (i.e., low-k) dielectric materials, poly-silicon, and silicon nitride.

While the process gas chemistry is selected to facilitate the etch process at the substrate surface, it poses a harsh environment for the interior surfaces of the processing chamber. The process gas can include corrosive gases that may be detrimental to components of the processing chamber, and may lead to the contamination of the substrate, hence reducing yield during the fabrication of integrated circuits (ICs)

SUMMARY OF THE INVENTION

The present invention relates to a system for treating a substrate, and to a system for treating a substrate with a process gas.

According to one embodiment, a treatment system is described for performing an etch process on a substrate using a corrosive gas, whereby a gas distribution system for dispersing the corrosive gas is designed to uniformly distribute process gas above the substrate while minimizing contamination to the substrate.

According to another embodiment, a treatment system is described, including a process chamber, including a process space. A process gas supply system is in fluid communication with the process chamber and configured to introduce a flow of a process gas to the process chamber. A gas distribution system is coupled to the process chamber and configured to receive the flow of the process gas through an inlet and distribute the flow of the process gas within a plenum to a plurality of openings in fluid communication with the process space. The gas distribution system includes a process gas diffuser located at the inlet to the gas distribution system and configured to diffuse the momentum of the flow of the process gas into the plenum. A holder is coupled to the process chamber and configured to support a substrate in the process chamber for exposure to the process gas. A vacuum pumping system is coupled to the process chamber and configured to evacuate the process chamber.

DETAILED DESCRIPTION OF SEVERAL EMBODIMENTS

In the following description, purposes of explanation and not limitation, specific details are set forth, such as a particular geometry of the vacuum or plasma processing system and descriptions of various components. However, it should be understood that the invention may be practiced in other embodiments that depart from these specific details.

In material processing methodologies, pattern etching comprises the application of a thin layer of light-sensitive material, such as photoresist, to an upper surface of a substrate, that is subsequently patterned in order to provide a mask for transferring this pattern to the underlying material during etching. The patterning of the light-sensitive material generally involves exposure by a radiation source through a reticle (and associated optics) of the light-sensitive material using, for example, a micro-lithography system, followed by the removal of the irradiated regions of the light-sensitive material (as in the case of positive photoresist), or non-irradiated regions (as in the case of negative resist) using a developing solvent.

Figure 1A:
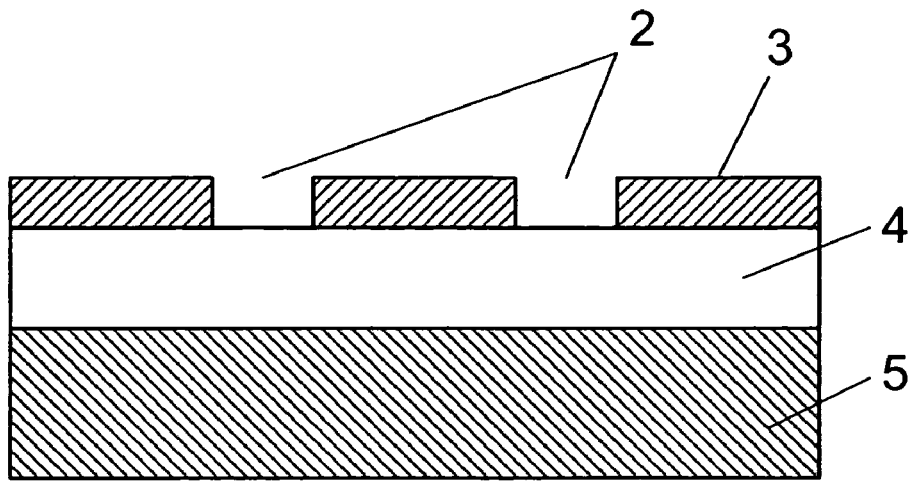
FIGS. 1A through 1C illustrate a schematic representation of a procedure for pattern etching a thin film.
Figure 1B:
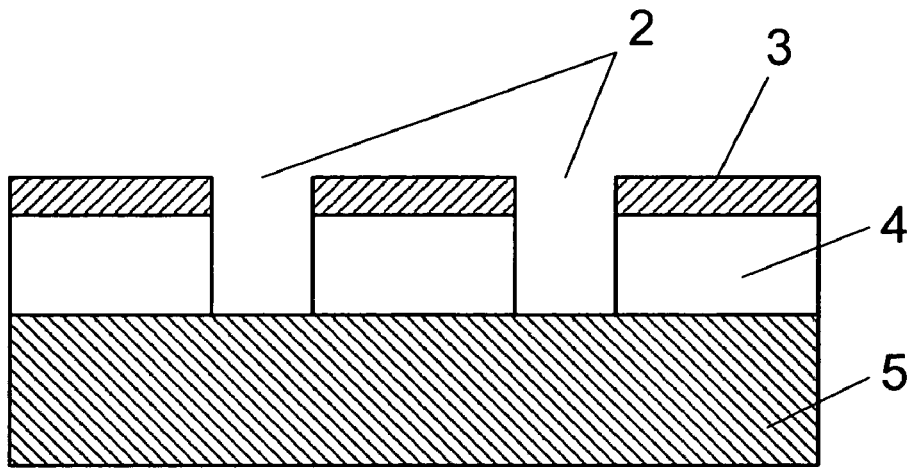
Figure 1C:
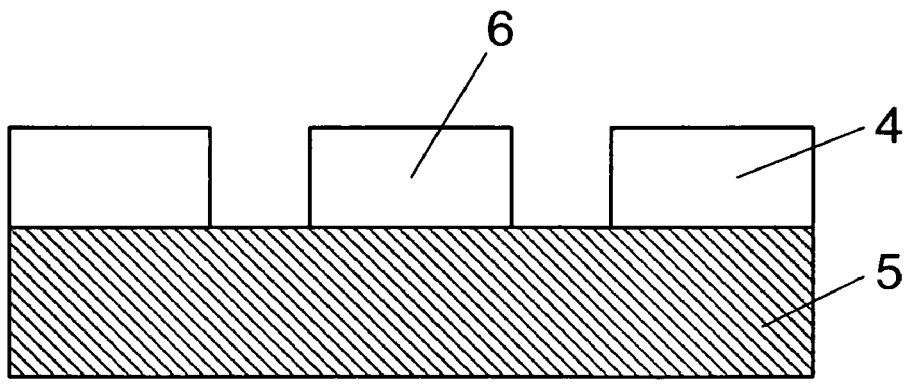

For example, as shown in FIGS. 1A through 1C, a mask comprising light-sensitive layer 3 with pattern 2 (such as patterned photoresist) can be utilized for transferring feature patterns into a material such as thin film 4, for example, a layer of polycrystalline silicon (polysilicon), on a substrate 5. The pattern 2 is transferred to the thin film 4 using, for instance, dry plasma etching, in order to form feature 6, such as a polysilicon gate, and upon completion of etching, the mask 3 is removed. Conventionally, the dry etching process involves the use of corrosive process gases, such as halogen containing gases (e.g., HBr, $Cl_2$, $NF_3$, etc.). The inventors have observed that the use of such gases can lead to particle contamination arising from the gas distribution system. Typically, the interior cavity of the gas distribution system comprises bare metal surfaces that are susceptible to corrosion by such process gases.

Figure 2:
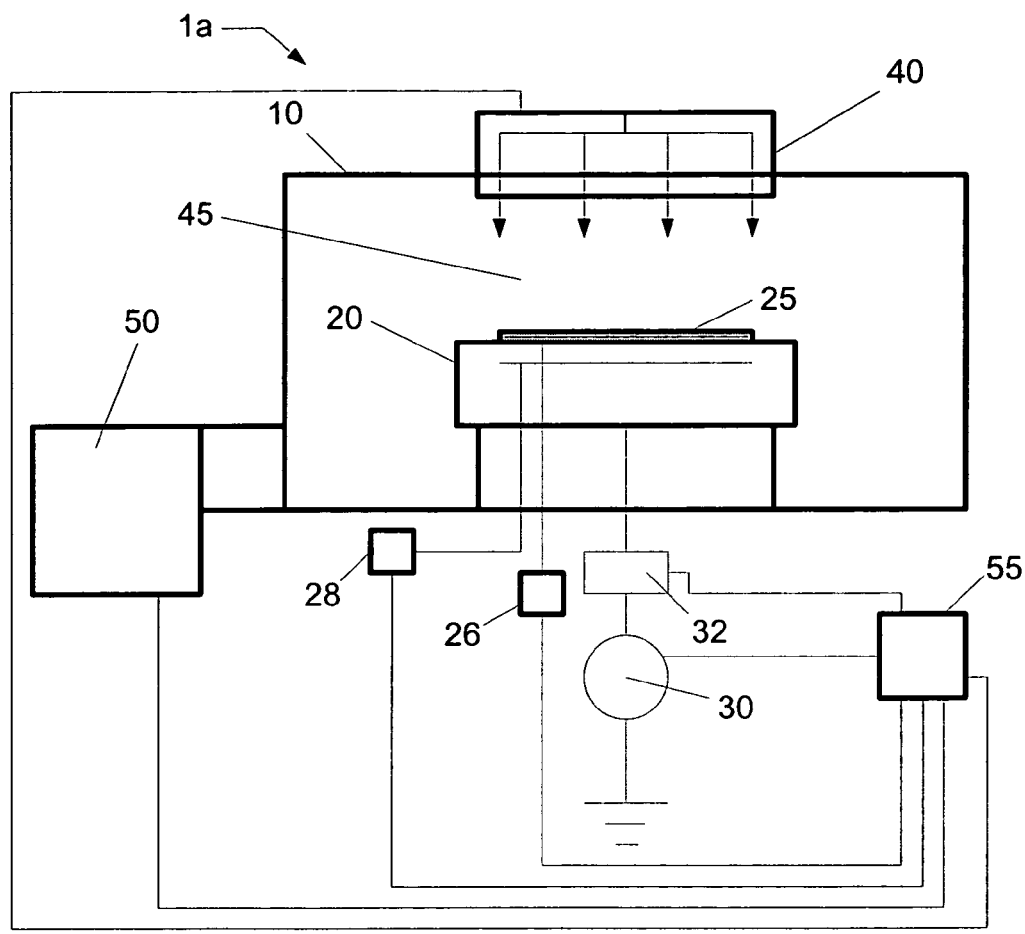
FIG. 2 shows a schematic representation of a plasma processing system according to an embodiment of the invention.

According to one embodiment, a plasma processing system 1 is depicted in FIG. 2 comprising a plasma processing chamber 10, substrate holder 20, upon which a substrate 25 to be processed is affixed, and vacuum pumping system 50. Substrate 25 can be a semiconductor substrate, a wafer or a liquid crystal display. Plasma processing chamber 10 can be configured to facilitate the generation of plasma in processing region 45 adjacent a surface of substrate 25. An ionizable gas or mixture of process gases is introduced via a gas distribution system 40 that is configured to reduce or minimize the introduction of contaminants to substrate 25. For a given flow of process gas, the process pressure is adjusted using the vacuum pumping system 50. Plasma can be utilized to create materials specific to a pre-determined materials process, and/or to aid the removal of material from the exposed surfaces of substrate 25. The plasma processing system 11a can be configured to process substrates of any desired size, such as 200 mm substrates, 300 mm substrates, or larger.

Substrate 25 can be affixed to the substrate holder 20 via a clamping system 28, such as a mechanical clamping system or an electrical clamping system (e.g., an electrostatic clamping system). Furthermore, substrate holder 20 can include a heating system (not shown) or a cooling system (not shown) that is configured to adjust and/or control the temperature of substrate holder 20 and substrate 25. The heating system or cooling system may comprise a re-circulating flow of heat transfer fluid that receives heat from substrate holder 20 and transfers heat to a heat exchanger system (not shown) when cooling, or transfers heat from the heat exchanger system to substrate holder 20 when heating. In other embodiments, heating/cooling elements, such as resistive heating elements, or thermoelectric heaters/coolers can be included in the substrate holder 20, as well as the chamber wall of the plasma processing chamber 10 and any other component within the plasma processing system 1a.

Additionally, a heat transfer gas can be delivered to the backside of substrate 25 via a backside gas supply system 26 in order to improve the gas-gap thermal conductance between substrate 25 and substrate holder 20. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 25.

In the embodiment shown in FIG. 2, substrate holder 20 can comprise an electrode through which RF power is coupled to the processing plasma in process space 45. For example, substrate holder 20 can be electrically biased at a RF voltage via the transmission of RF power from a RF generator 30 through an optional impedance match network 32 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 32 can improve the transfer of RF power to plasma in plasma processing chamber 10 by reducing the reflected power. Match network topologies (e.g. L-type, π-type, T-type, etc.) and automatic control methods are well known to those skilled in the art.

Vacuum pump system 50 can include a turbo-molecular vacuum pump (TMP) capable of a pumping speed up to about 5000 liters per second (and greater) and a gate valve for throttling the chamber pressure. In conventional plasma processing devices utilized for dry plasma etch, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Controller 55 comprises a microprocessor, memory, and a digital I/O port capable of generating control voltages sufficient to communicate and activate inputs to plasma processing system 1a as well as monitor outputs from plasma processing system 1a. Moreover, controller 55 can be coupled to and can exchange information with RF generator 30, impedance match network 32, the gas distribution system 40, vacuum pump system 50, as well as the substrate heating/cooling system (not shown), the backside gas delivery system 28, and/or the electrostatic clamping system 26. For example, a program stored in the memory can be utilized to activate the inputs to the aforementioned components of plasma processing system 1a according to a process recipe in order to perform a plasma assisted process on substrate 25. One example of controller 55 is a DELL PRECISION WORKSTATION 610™, available from Dell Corporation, Austin, Tex.

Controller 55 can be locally located relative to the plasma processing system 1a, or it can be remotely located relative to the plasma processing system 1a. For example, controller 55 can exchange data with plasma processing system 1a using a direct connection, an intranet, and/or the internet. Controller 55 can be coupled to an intranet at, for example, a customer site (i.e., a device maker, etc.), or it can be coupled to an intranet at, for example, a vendor site (i.e., an equipment manufacturer). Alternatively or additionally, controller 55 can be coupled to the internet. Furthermore, another computer (i.e., controller, server, etc.) can access controller 55 to exchange data via a direct connection, an intranet, and/or the internet.

In the embodiment shown in FIG. 3, the plasma processing system 1b can be similar to the embodiment of FIG. 2 and further comprise either a stationary, or mechanically or electrically rotating magnetic field system 60, in order to potentially increase plasma density and/or improve plasma processing uniformity, in addition to those components described with reference to FIG. 2. Moreover, controller 55 can be coupled to magnetic field system 60 in order to regulate the speed of rotation and field strength. The design and implementation of a rotating magnetic field is well known to those skilled in the art.

Figure 3:
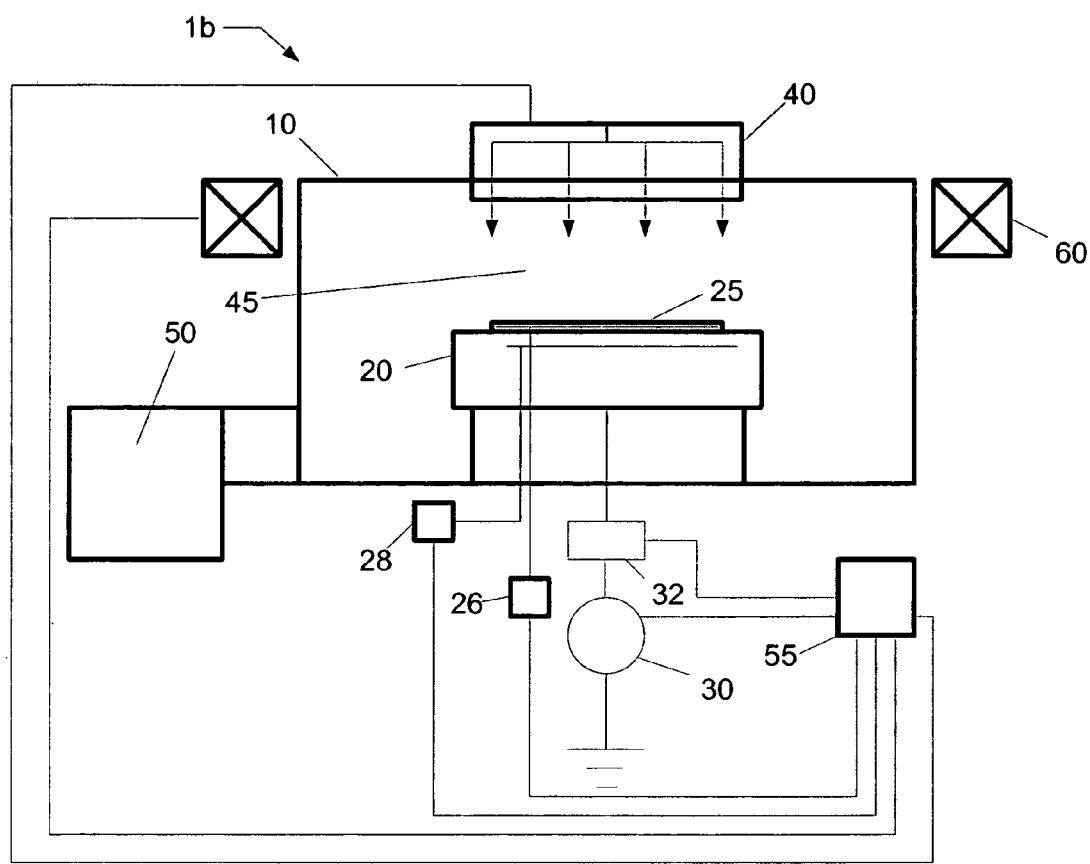
FIG. 3 shows a schematic representation of a plasma processing system according to another embodiment of the invention.
Figure 4:
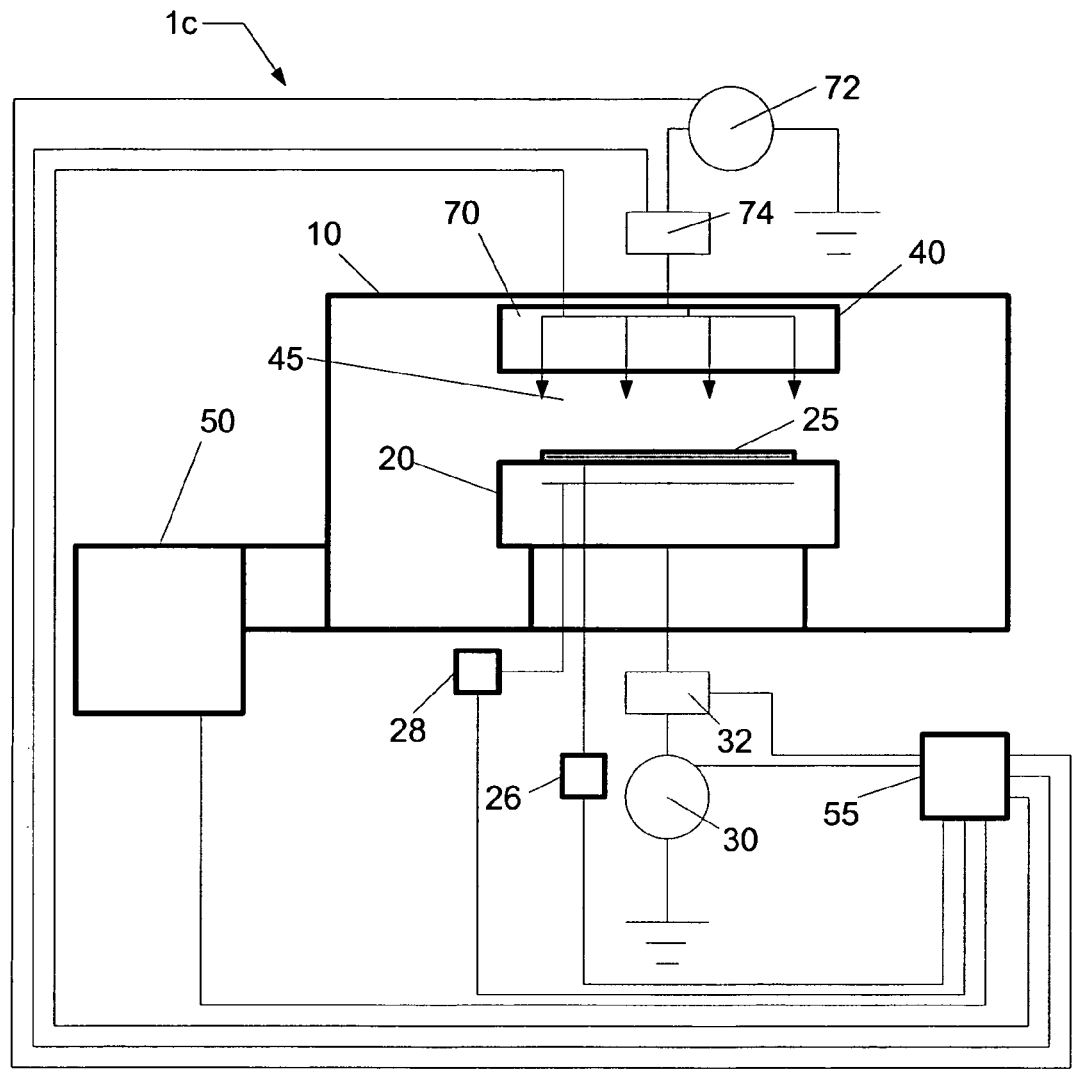
FIG. 4 shows a schematic representation of a plasma processing system according to another embodiment of the invention.

In the embodiment shown in FIG. 4, the plasma processing system 1c can be similar to the embodiment of FIG. 2 or FIG. 3, and can further comprise an upper electrode 70 to which RF power can be coupled from RF generator 72 through optional impedance match network 74. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 55 is coupled to RF generator 72 and impedance match network 74 in order to control the application of RF power to upper electrode 70. The design and implementation of an upper electrode is well known to those skilled in the art. The upper electrode 70 and the gas distribution system 40 can be designed within the same chamber assembly, as shown.

Figure 5:
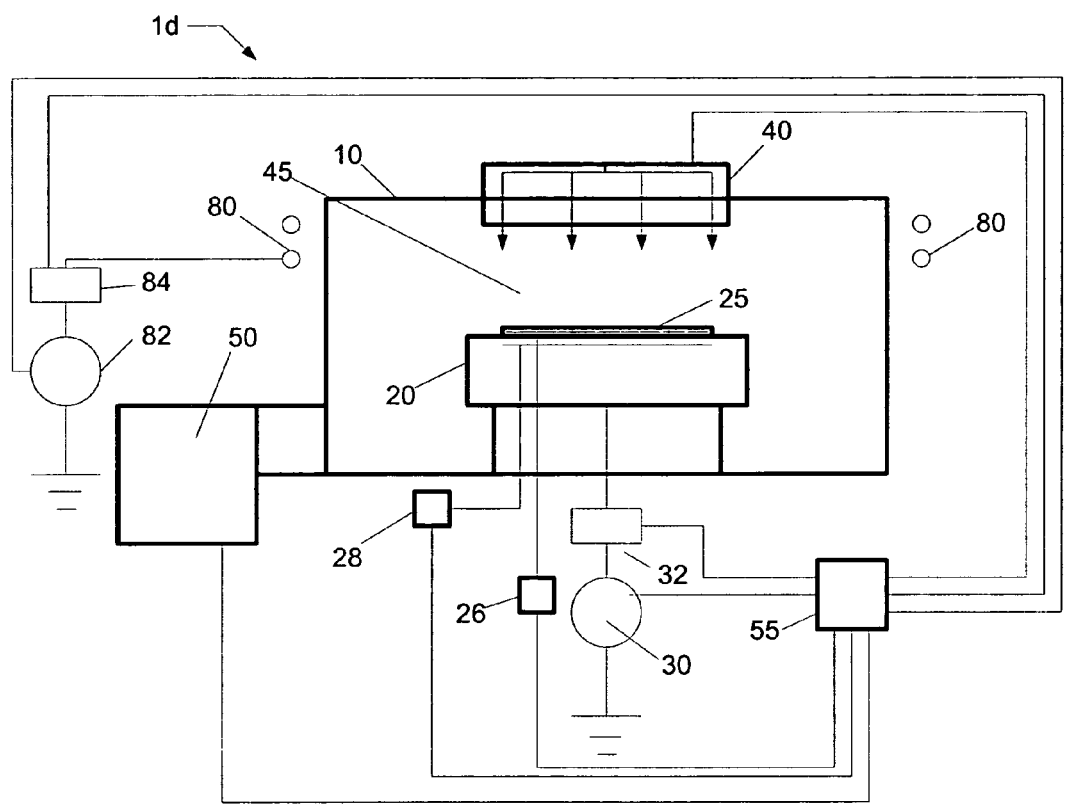
FIG. 5 shows a schematic representation of a plasma processing system according to another embodiment of the invention.

In the embodiment shown in FIG. 5, the plasma processing system 1*d* can be similar to the embodiments of FIGS. 2 and 3, and can further comprise an inductive coil 80 to which RF power is coupled via RF generator 82 through optional impedance match network 84. RF power is inductively coupled from inductive coil 80 through a dielectric window (not shown) to plasma processing region 45. A frequency for the application of RF power to the inductive coil 80 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 80 and plasma. Moreover, controller 55 can be coupled to RF generator 82 and impedance match network 84 in order to control the application of power to inductive coil 80. In an alternate embodiment, inductive coil 80 can be a "spiral" coil or "pancake" coil in communication with the plasma processing region 45 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

In the following discussion, a gas distribution system for introducing a process gas to a vacuum processing system is presented. The gas distribution system may, for example, be utilized (as illustrated by label 40) in any one of the plasma processing systems described in FIGS. 2 through 5, or a plasma processing system with any combination of features from the systems of FIGS. 2 through 5.

Figure 6A:
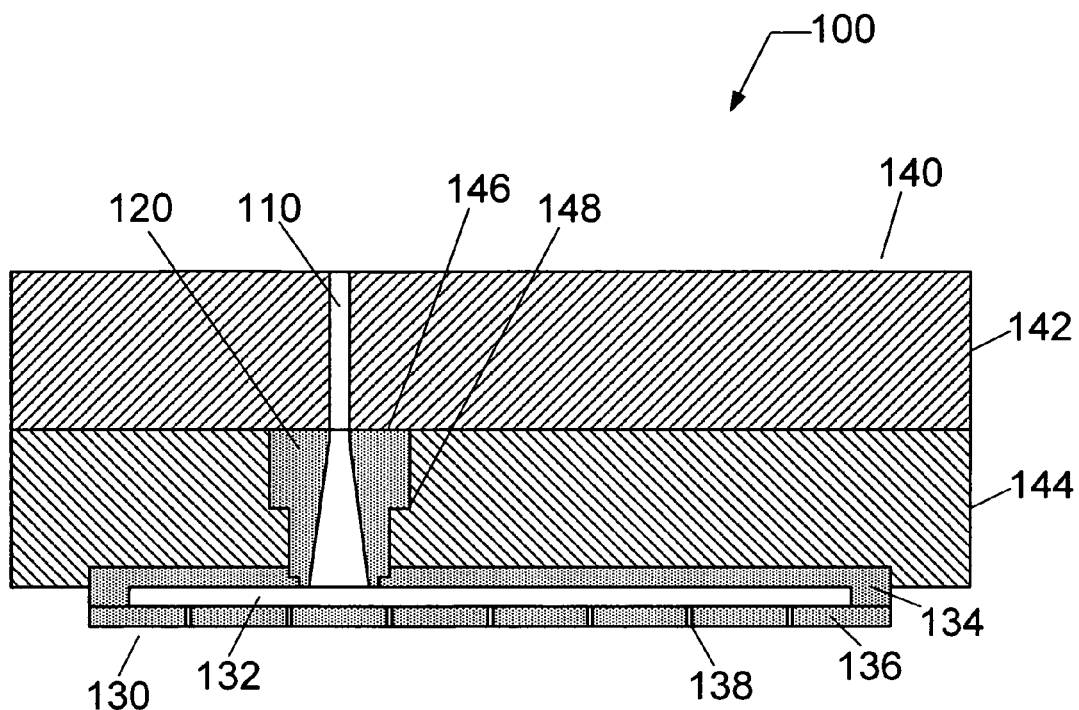
FIGS. 6A and 6B illustrate a gas distribution system according to another embodiment of the invention.
Figure 6B:
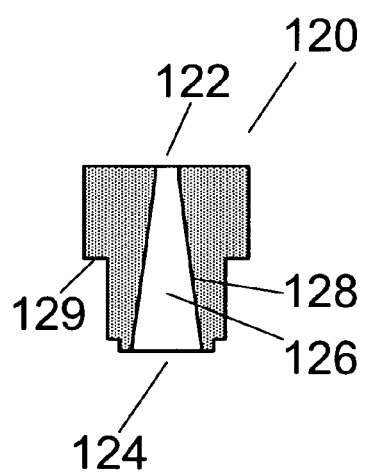

Referring now to FIGS. 6A and 6B, a gas distribution system 100 is presented according to one embodiment. The gas distribution system 100 is configured to be coupled to a processing chamber and to receive a flow of a process gas from a process gas supply system through a gas supply inlet 110 and distribute the flow of the process gas within a plenum 132 to a plurality of openings 138 in fluid communication with a process space in the processing chamber. Furthermore, the gas distribution system 100 comprises a process gas diffuser 120 located at the inlet 110 to the gas distribution system 100, wherein the process gas diffuser 120 is configured to diffuse the momentum of the flow of the process gas into the plenum 132 such that the process gas is distributed to each of the plurality of openings 138 in such a way that the non-uniformity in plenum pressure is reduced.

As shown in FIG. 6A, the gas distribution system 100 may comprise an upper assembly 140 configured to be coupled to the processing chamber. The upper assembly 140 may or may not comprise an electrode assembly. The upper assembly 140 may be coupled to electrical ground as in FIGS. 2, 3 and 5, or the upper assembly 140 may be coupled to electrical power as in FIG. 4 (label 70). The upper assembly 140 can include an electrode assembly having a first plate 142, through which gas supply inlet 110 is formed, and a second plate 144 coupled to the first plate 142, wherein the combination of the first and second plates are configured to retain the process gas diffuser 120 between a support shelf 148 formed in the second plate 144 and a surface 146 of the first plate 142. Vacuum sealing devices, such as elastomer O-rings, may be utilized to provide a vacuum seal between the first plate 142, the second plate 144 and the process gas diffuser 120. Alternatively, the assembly 140, including the process gas diffuser 120, can comprise a monolithic piece.

Additionally, the gas distribution system 100 comprises a gas injection system 130 coupled to the upper assembly 140 and configured to receive the flow of process gas from the process gas diffuser 120. The gas injection system 130 comprises a housing 134 and a gas distribution plate 136 coupled to the housing 134, wherein the gas distribution plate 136 comprises the plurality of openings 138 that facilitates a uniform flow of process gas from plenum 132 to the processing space in the processing chamber.

As illustrated in FIG. 6B, the process gas diffuser 120 comprises a lip 129 configured to be captured by the support shelf 148 in the second plate 144, and further comprises a diffuser inlet 122 configured to be coupled with the gas supply inlet 110, a diffuser outlet 124 configured to be coupled with the plenum 132 in gas injection system 130, and a divergent passage 126 extending from the diffuser inlet 122 to the diffuser outlet 124. The divergent passage 126 may comprise a conical passage, wherein the half angle of the diffuser wall 128 is less than or equal to approximately 20 degrees. Desirably, the half angle of the diffuser wall 128 is less than or equal to approximately 18 degrees, and more desirably, the half angle of the diffuser wall is less than or equal to approximately 15 degrees. As illustrated in FIG. 6B, the outlet area at the diffuser outlet 124 is larger than the inlet area at the diffuser inlet 122. When the outlet area is twice as large as the inlet area, the pressure recovery associated with the impact of the process gas flow on gas distribution plate 136 is reduced by a factor of four. When the outlet area is four times as large as the inlet area, the pressure recovery associated with the impact of the process gas flow on gas distribution plate 136 is reduced by a factor of sixteen.

The plurality of openings 138 in gas distribution plate 136 can range in number from approximately 1 opening to approximately 1000 openings, and desirably they may range in number from approximately 10 openings to approximately 100 openings. The gas distribution plate 136 can be designed with the plurality of openings 138, each opening having a diameter ranging from approximately 0.5 mm to approximately 10 mm, and desirably ranging from approximately 0.5 mm to approximately 2 mm. Alternatively, the gas distribution plate 136 can be designed with the plurality of openings 138, each opening having a length ranging from approximately 1 mm to approximately 20 mm, and desirably ranging from approximately 1 mm to approximately 3 mm.

By utilizing the process gas diffuser 120 and not locating one or more of the plurality of openings 138 directly opposite the diffuser outlet 124, the variation of pressure within the plenum 132 can be reduced, particularly near the diffuser outlet 124, and the potential for a non-uniform flux of process gas through the plurality of openings 138 can be mitigated. Additionally, the plenum height may be reduced and the conventional use of a baffle plate located within the plenum 132 between the inlet plane of the plenum 132 and the gas distribution plate 136 may be eliminated, thus allowing for reduction of the overall thickness of the gas injection system 130. The gas injection system 130 can be fabricated from a dielectric material. The plenum height may be designed to be less than approximately 5 mm, and desirably the plenum height can be designed to be less than approximately 3 mm.

The gas distribution system 100, including the upper assembly 140, the process gas diffuser 120 and the gas injection system 130, may be fabricated from a metal, such as aluminum or anodized aluminum, or a ceramic. Any one of these components may be fabricated from quartz, silicon, silicon nitride, silicon carbide, alumina, aluminum nitride, sapphire, carbon etc., or any combination of two or more thereof. Additionally, any one of these components, such as interior surfaces of these components, can be coated with a ceramic material, such as aluminum oxide or yttrium oxide. For example, any one of these components, such as interior surfaces of these components; may be coated with a material including $Al_2O_3$, $Sc_2O_3$, $Sc_2F_3$, $YF_3$, $La_2O_3$, $Y_2O_3$, or $DyO_3$. Alternatively these surfaces may be coated with a column III element.

In one example, the upper assembly 140 is fabricated from aluminum with or without surface anodization. The upper assembly 140 can serve as an electrode assembly and it can be coupled to an electrical power source, such as a radio frequency (RF) power source. The gas injection system 130 can be fabricated from a dielectric material, such as quartz, in order to permit the coupling of RF power from the upper assembly 140 through the gas injection system 130 to the process gas in the processing space. Additionally, the process gas diffuser 120 can be fabricated from a dielectric material, such as quartz. When the process gas contains a corrosive gas, such as HBr, $Cl_2$, $NF_3$, etc., the process gas diffuser 120 and the gas injection system 130 can be fabricated from quartz in order to minimize contamination of the substrate in the processing chamber.

Figure 7A:
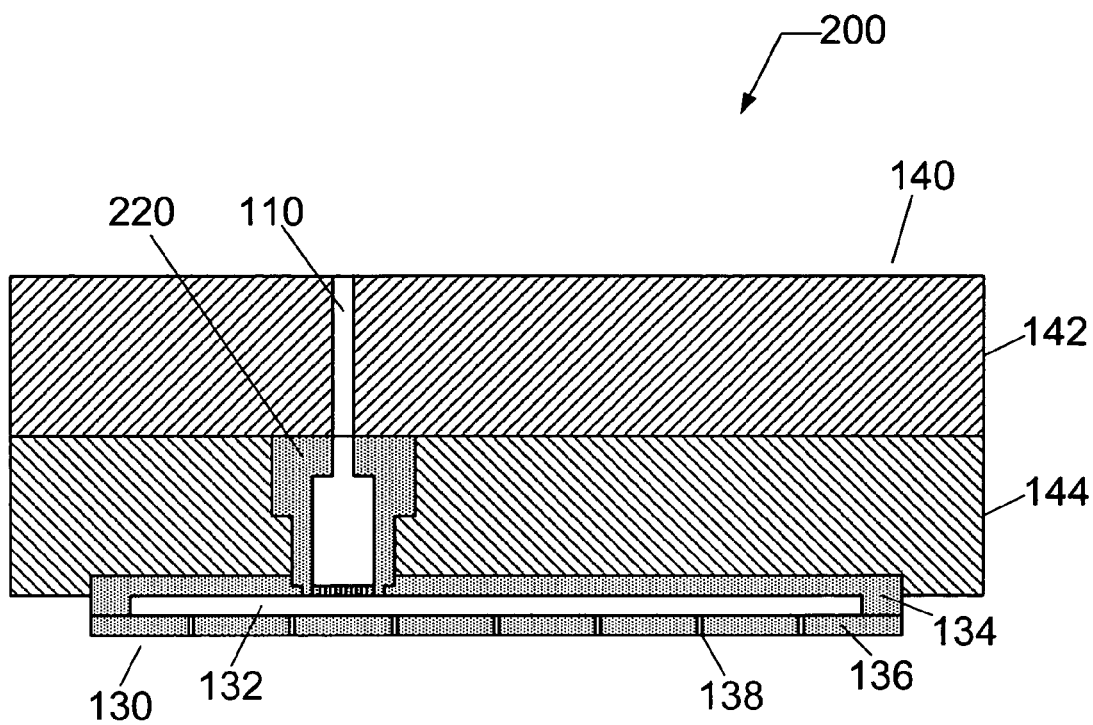
FIGS. 7A and 7B illustrate a gas distribution system according to another embodiment of the invention.
Figure 7B:
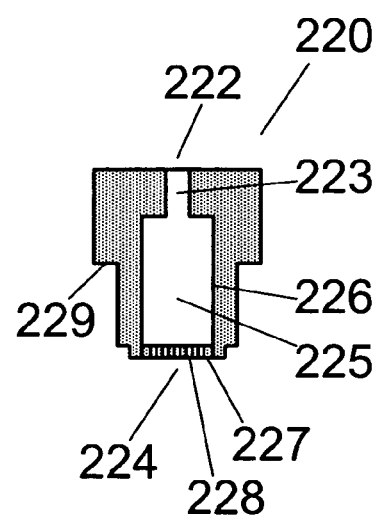

Referring now to FIGS. 7A and 7B, a gas distribution system 200 is presented according to another embodiment. The gas distribution system 200 can be similar to the embodiment of FIG. 6A, wherein like reference numerals designate similar parts. The gas distribution system 200 is configured to be coupled to a processing chamber and to receive a flow of a process gas from a process gas supply system through a gas supply inlet 110 and distribute the flow of the process gas within a plenum 132 to a plurality of openings 138 in fluid communication with a process space in the processing chamber. Furthermore, the gas distribution system 200 comprises a process gas diffuser 220 located at the inlet 110 to the gas distribution system 200, wherein the process gas diffuser 220 is configured to diffuse the momentum of the flow of the process gas into the plenum 132 such that the process gas is distributed to each of the plurality of openings 138 in such a way that the non-uniformity in plenum pressure is reduced.

As illustrated in FIG. 7B, the process gas diffuser 220 comprises a lip 229 configured to be captured by the support shelf 148 in the second plate 144, and further comprises a diffuser inlet 222 configured to be coupled with the gas supply inlet 110, a diffuser outlet 224 configured to be coupled with the plenum 132 in gas injection system 130, and a divergent passage 226 extending from the diffuser inlet 222 to the diffuser outlet 224. The process gas diffuser 220 further comprises an orifice plate 228, having one or more orifices 227, located at the diffuser outlet 224. The divergent passage 226 may comprise a cross-section that gradually varies from the diffuser inlet 222 to the diffuser outlet 224, as in FIG. 6B, or the divergent passage may comprise a cross-section that abruptly varies from an inlet section 223 to an outlet section 225, as in FIG. 7B. For example, the inlet diameter of the inlet section 223 can abruptly expand to the outlet diameter of the outlet section 225.

Figure 8:
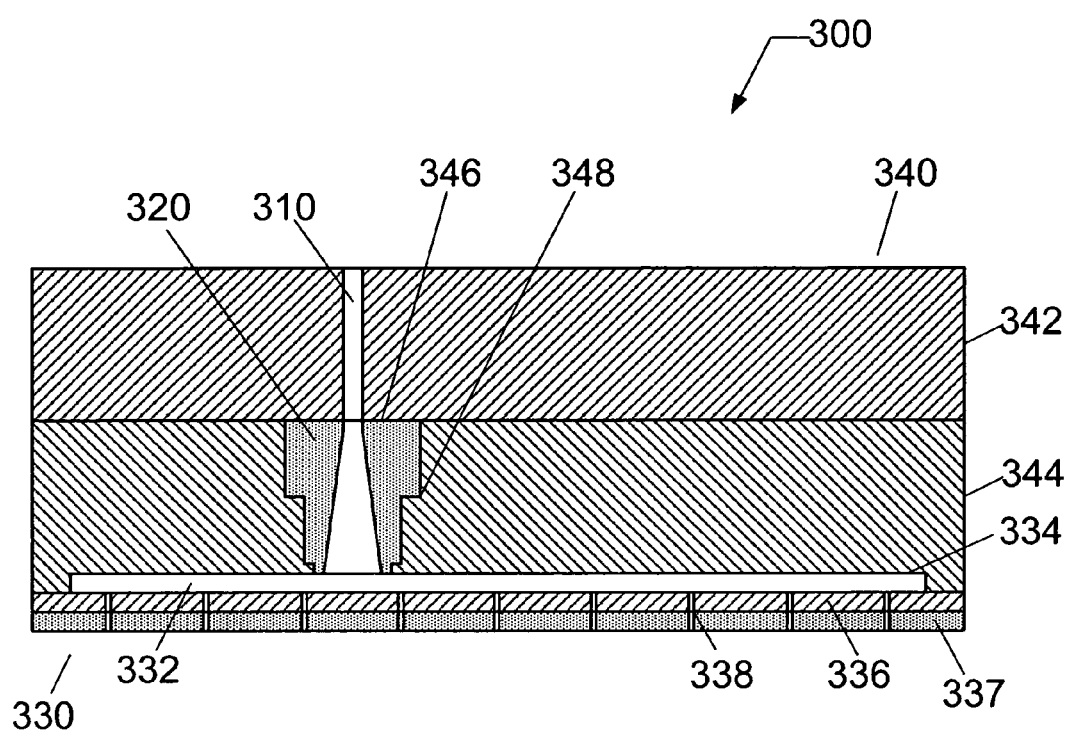
FIG. 8 illustrates a gas distribution system according to another embodiment of the invention.

Referring now to FIG. 8, a gas distribution system 300 is presented according to another embodiment. The gas distribution system 300 is configured to be coupled to a processing chamber and to receive a flow of a process gas from a process gas supply system through a gas supply inlet 310 and distribute the flow of the process gas within a plenum 332 to a plurality of openings 338 in fluid communication with a process space in the processing chamber. Furthermore, the gas distribution system 300 comprises a process gas diffuser 320 located at the inlet 310 to the gas distribution system 300, wherein the process gas diffuser 320 is configured to diffuse the momentum of the flow of the process gas into the plenum 332 such that the process gas is distributed to each of the plurality of openings 338 in such a way that the non-uniformity in plenum pressure is reduced.

As shown in FIG. 8, the gas distribution system 300 may comprise an upper assembly 340 configured to be coupled to the processing chamber. The upper assembly 340 may or may not comprise an electrode assembly. The upper assembly 340 may be coupled to electrical ground as in FIGS. 2, 3 and 5, or the upper assembly 340 may be coupled to electrical power as in FIG. 4 (label 70). For example, the upper assembly 340 can include an electrode assembly having a first plate 342, through which gas supply inlet 310 is formed, and a second plate 344 coupled to the first plate 342, wherein the combination of the first and second plates are configured to retain the process gas diffuser 320 between a support shelf 348 formed in the second plate 344 and a surface 343 of the first plate 342. Vacuum sealing devices, such as elastomer O-rings, may be utilized to provide a vacuum seal between the first plate 342, the second plate 344 and the process gas diffuser 320. Alternatively, the assembly 340, including the process gas diffuser 320, comprises a monolithic piece.

Additionally, the gas distribution system 300 comprises a gas injection system 330 integrated with the upper assembly 340 and configured to receive the flow of process gas from the process gas diffuser 320. The gas injection system 330 comprises a recess 334 formed in the second plate 344 and a gas distribution plate 336 coupled to the second plate 344, wherein the gas distribution plate 336 comprises the plurality of openings 338 that facilitates a uniform flow of process gas from plenum 332 to the processing space in the processing chamber. The process gas diffuser 320 can include the process gas diffuser 120 illustrated in FIG. 6B, or it may include the process gas diffuser 220 illustrated in FIG. 7B.

The plurality of openings 338 in gas distribution plate 336 can range in number from approximately 1 opening to approximately 1000 openings, and desirably they may range in number from approximately 10 openings to approximately 100 openings. The gas distribution plate 336 can be designed with the plurality of openings 338, each opening having a diameter ranging from approximately 0.5 mm to approximately 10 mm, and desirably ranging from approximately 0.5 mm to approximately 2 mm. Alternatively, the gas distribution plate 336 can be designed with the plurality of openings 338, each opening having a length ranging from approximately 1 mm to approximately 20 mm, and desirably ranging from approximately 1 mm to approximately 3 mm.

By utilizing the process gas diffuser 320 and not locating one or more of the plurality of openings 338 directly opposite the diffuser outlet, the variation of pressure within the plenum 332 can be reduced, particularly near the diffuser outlet, and the potential for a non-uniform flux of process gas through the plurality of openings 338 can be mitigated. Additionally, the plenum height may be reduced and the conventional use of a baffle plate located within the plenum 332 between the inlet plane of the plenum 332 and the gas distribution plate 336 may be eliminated, thus allowing for reduction of the overall thickness of the gas injection system 330. The gas injection system 330 can be fabricated from a dielectric material. The plenum height may be designed to be less than approximately 5 mm, and desirably the plenum height can be designed to be less than approximately 3 mm.

The gas distribution system 300, including the upper assembly 140, the process gas diffuser 320 and the gas injection system 330, may be fabricated from a metal, such as aluminum or anodized aluminum, or a ceramic. For example, any one of these components may be fabricated from quartz, silicon, silicon nitride, silicon carbide, alumina, aluminum nitride, etc. Additionally, any one of these components, such as interior surfaces of these components, can be coated with a ceramic material, such as aluminum oxide or yttrium oxide. Any one of these components, such as interior surfaces of these components, may be coated with a material including $Al_2O_3$, $Sc_2O_3$, $Sc_2F_3$, $YF_3$, $La_2O_3$, $Y_2O_3$, and $DyO_3$.

In one example, the upper assembly 340 is fabricated from aluminum with or without surface anodization. The upper assembly 340 can serve as an electrode assembly and it can be coupled to an electrical power source, such as a radio frequency (RF) power source. The gas distribution plate 336 can be fabricated from a dielectric material, such as quartz, or it may be fabricated from aluminum or anodized aluminum in order to permit the coupling of RF power from the upper assembly 340 to the process gas in the processing space. Additionally, the process gas diffuser 320 can be fabricated from a dielectric material, such as quartz. For instance, when the process gas contains a corrosive gas, such as HBr, $Cl_2$, $NF_3$, etc., the process gas diffuser 320 can be fabricated from quartz in order to minimize contamination of the substrate in the processing chamber, and the interior surfaces of the recess 334 and the gas distribution plate 336 can be coated. Optionally, a sacrificial gas distribution plate 337 having a plurality of through-holes aligned with the plurality of openings 338 in gas distribution plate 336 may be used. The sacrificial gas distribution plate 337 may be fabricated from quartz, silicon, silicon nitride, silicon carbide, alumina, aluminum nitride, etc.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A treatment system, comprising:
  a process chamber, including a process space;
  a process gas supply system in fluid communication with said process chamber and configured to introduce a flow of a process gas to said process chamber;
  a gas distribution system coupled to said process chamber, said gas distribution system comprises a housing and a gas distribution plate coupled to said housing, the combination of which defines a plenum which receives said flow of said process gas through an entrance to said plenum and distributes said flow of said process gas to a plurality of openings in said gas distribution plate that are in fluid communication with said process space, wherein said housing and said gas distribution plate are formed of a dielectric material, wherein said gas distribution system comprises a process gas diffuser that comprises a divergent passage having an inlet coupled to an exit of said process gas supply system, and an outlet coupled to said plenum and located at said entrance to said plenum of said gas distribution system, said process gas diffuser diffuses the momentum of said flow of said process gas into said plenum, and wherein said outlet of said process gas diffuser comprises a cross-sectional area that is larger than a cross-sectional area of said inlet of said process gas diffuser and smaller than a cross-sectional area of said plenum;
  a holder coupled to said process chamber and configured to support a substrate in said process chamber for exposure to said process gas;
  a vacuum pumping system coupled to said process chamber and configured to evacuate said process chamber; and
  an upper electrode coupled to said process chamber and disposed opposite said holder, wherein said upper electrode is coupled to a radio frequency (RF) generator and configured to form plasma in said process space by coupling RF power from said RF generator to said upper electrode and through said gas distribution system to said process gas in said process space, and wherein said gas distribution system is disposed between said upper electrode and said holder.

2. The treatment system of claim 1, wherein said divergent passage comprises a conical passage having a half angle less than or equal to approximately 20 degrees.

3. The treatment system of claim 1, wherein said divergent passage comprises a conical passage having a half angle less than or equal to approximately 18 degrees.

4. The treatment system of claim 1, wherein said divergent passage comprises a conical passage having a half angle less than or equal to approximately 15 degrees.

5. The treatment system of claim 1, wherein said process gas diffuser further comprises an orifice plate, separate from said gas distribution plate, at said outlet of said divergent passage.

6. The treatment system of claim 5, wherein said divergent passage comprises a cylindrical inlet having an inlet diameter and a cylindrical outlet having an outlet diameter that is larger than said inlet diameter.

7. The treatment system of claim 6, wherein said inlet diameter steps out to said outlet diameter.

8. The treatment system of claim 1, further comprising a coating disposed on at least one interior surface of said gas distribution system.

9. The treatment system of claim 8, wherein said coating is an anodic layer.

10. The treatment system of claim 8, wherein said coating contains at least one column III element.

11. The treatment system of claim 8, wherein said coating contains a material including $Al_2O_3$, $Sc_2O_3$, $Sc_2F_3$, $YF_3$, $La_2O_3$, $Y_2O_3$, or $DyO_3$.

12. The treatment system of claim 1, wherein said gas distribution system is formed of aluminum having a coating thereon.

13. The treatment system of claim 1, wherein said housing, said gas distribution plate, and said process gas diffuser are formed of quartz, alumina, aluminum nitride, sapphire, silicon, silicon nitride, silicon carbide, or carbon, or a combination of two or more thereof.

14. The treatment system of claim 1, wherein said plenum comprises a cylindrical volume having a height less than or equal to approximately 5 mm.

15. The treatment system of claim 1, wherein said plenum comprises a cylindrical volume having a height less than or equal to approximately 3 mm.

16. The treatment system of claim 1, wherein:
  said outlet of said process gas diffuser is positioned opposite from a portion of said gas distribution plate void of any of said plurality of openings.

* * * * *